United States Patent [19]

Stich

[11] 4,423,458

[45] Dec. 27, 1983

[54] SIGNAL PROCESSING SYSTEM FOR OVERLOAD RELAY OR THE LIKE

[75] Inventor: Frederick A. Stich, Milwaukee, Wis.

[73] Assignee: Siemens-Allis, Inc., Atlanta, Ga.

[21] Appl. No.: 365,164

[22] Filed: Apr. 5, 1982

[51] Int. Cl.³ .............................................. H02H 3/08
[52] U.S. Cl. ...................................... 361/93; 361/87; 364/483
[58] Field of Search ........................ 361/93, 98, 96, 97, 361/103, 31, 87, 94; 340/825.64, 825.65, 643; 364/483

[56] References Cited

U.S. PATENT DOCUMENTS

| | | | |
|---|---|---|---|
| 4,017,766 | 4/1977 | Vercellotti et al. | 361/96 X |
| 4,103,317 | 7/1978 | Krick | 361/31 |
| 4,180,842 | 12/1979 | Keeney | 361/85 |
| 4,219,858 | 8/1980 | DePuy et al. | 361/96 X |
| 4,241,410 | 12/1980 | DePuy | 364/715 |
| 4,259,706 | 3/1981 | Zocholl | 361/96 |
| 4,275,445 | 6/1981 | Elizaran | 364/480 |
| 4,291,355 | 9/1981 | Dinger | 361/96 X |
| 4,301,491 | 11/1981 | Gryctko | 361/93 |
| 4,305,108 | 12/1981 | Udren | 361/96 |
| 4,327,391 | 4/1982 | Grzebielski | 361/96 X |

FOREIGN PATENT DOCUMENTS

| | | |
|---|---|---|
| 139502 | 1/1980 | Fed. Rep. of Germany . |
| 2073969 | 10/1981 | United Kingdom . |
| 2073973 | 10/1981 | United Kingdom . |

OTHER PUBLICATIONS

"Analog to Digital Conversion Techniques with COPS Family Microcontrollers" National Semiconductor Company 2/80.
"GE Lod-Trak (tm) Solid State Motor Protection Instructions" pp. 46-51 & 58-60 8/79.

Primary Examiner—Harry E. Moose, Jr.
Attorney, Agent, or Firm—Frederick W. Powers

[57] ABSTRACT

An improved system for sensing current flow in a single phase or polyphase circuit to be protected and deriving a single signal representing composite current flow. A ramp-like reference signal is applied to one input of a comparator at sampling intervals, and the outputs of a plurality of current amplifiers coupled to the other comparator input so that the duration of a change in signal output level of the comparator is an inverse function of composite current. An accumulator stage stores portions of incoming current signals less a predetermined fraction of previous accumulator contents. In the event of circuit interruption the accumulator is decremented in a manner which reflects the inferred thermal history of the system.

20 Claims, 10 Drawing Figures

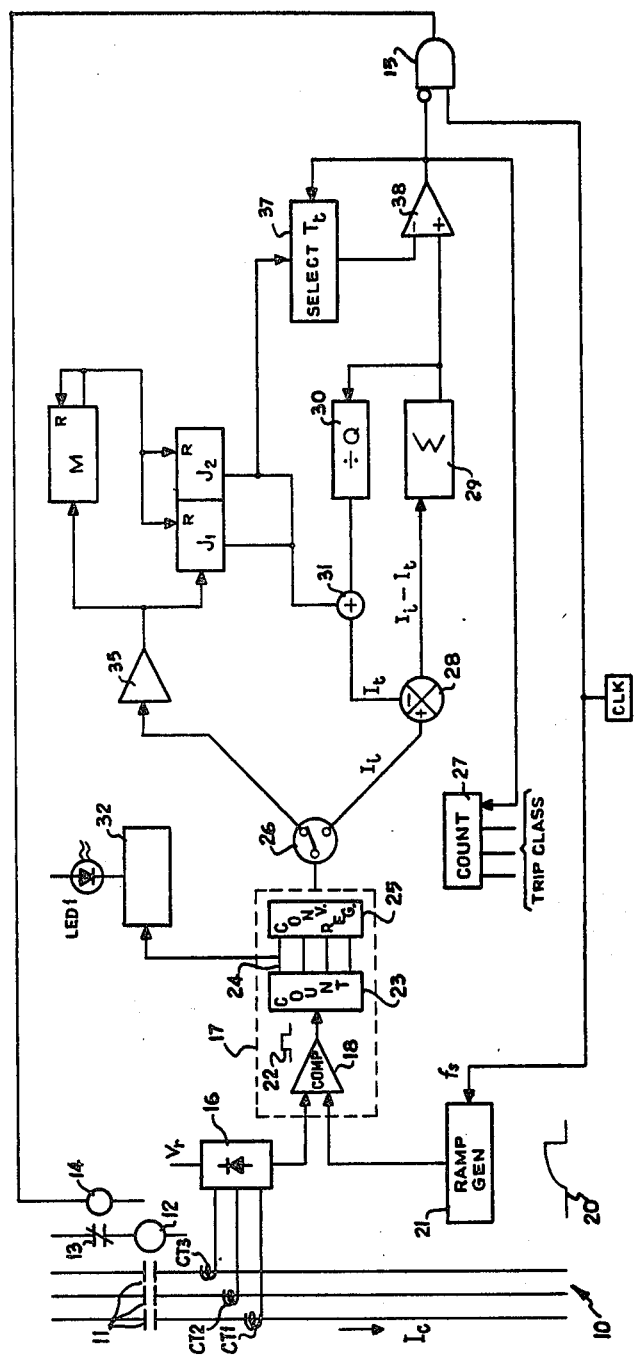

SIGNAL PROCESSING SYSTEM FOR OVERLOAD RELAY OR THE LIKE

RELATED APPLICATIONS

The subject matter described in this application is related to the material disclosed in co-filed patent applications Ser. No. 365,378 "Electronic Control System for Overload Relay or the Like"—F. Stich; P-115 "Power Supply for Electronic Control System"—F. Stich; and Ser. No. 365,554 "Solid State Circuit Protection and Method"—F. Stich and C. Williams.

BACKGROUND OF THE INVENTION

The present invention relates to electrical circuit protection devices such as overload relays, and more particularly to an improved and highly flexible electronic control system therefor.

Circuit protection devices such as circuit breakers, relays, contactors and the like are commonly used for disconnecting electrical circuits upon the detection of undesired currents. In addition to breaking the circuits in which the currents flow, other functions may be provided such as actuating alarms and safety devices, or the control of other apparatus in response to a sensed current characteristic. While in principle the opening of an electrical circuit in response to undesirably high currents is a simple procedure, in practice the operation of such protective devices is highly complex owing to the various, often conflicting requirements of electrical systems.

For instance, while it is necessary to protect electric motors from high currents which could damage or destroy the windings, in order to start a motor under load a high initial current is required. Also, during the operation of various electrical equipment, for instance under changing loads, high current flow must be tolerated for short periods of time. Further a single "threshold" for current flow cannot be assigned since a small overcurrent condition can be tolerated far longer than a high overcurrent condition. For these reasons industrial relays and contactors are commonly provided with complex control mechanisms which make use of two or more different current-responsive stages in an attempt to "tailor" the tripping characteristics of the device to a desired application.

In principle it is known that more sophisticated control systems can be designed which replace the present electromechanical, magnetic, and thermal controls. If cost were not a consideration a number of approaches could be implemented for deriving a measure of current flow and converting it into appropriate digital form. However for small, inexpensive control devices such as overload relays conventional means of deriving and processing signals have proven prohibitively expensive and overly complex.

Recently efforts have been made to design electronic control systems which make use of digital and other allied signal processing techniques which will provide the desired functional flexibility, and eliminate the need for mechanical adaptations to change the range or operating characteristics of a control. Two examples of such a system are shown in U.S. Pat. Nos. 4,219,585—DePuy et al and 4,219,860—DePuy. These patents disclose an overcurrent relay control which utilizes digital sampling, multiplexing and signal accumulation techniques for detecting overcurrent conditions in one or more phases of a multiphase electrical system. However, while quite flexible such systems are comparatively complex and therefore expensive. Reducing the complexity of such a control system or the sensing elements which it utilizes ordinarily results in a loss of accuracy or resolution and overall capability. It will therefore be appreciated that it would be highly desirable to provide an improved circit interrupting control whose characteristics can be varied without the need for physically interchanging or adding special elements and which utilizes relatively inexpensive signal processing apparatus.

It is therefore an object of the present invention to provide an improved sensing and control apparatus for circuit interrupters of the overload relay and contactor type.

Another object is to provide an interrupter control system which can be utilized to monitor single or plural phase electric power sources.

Another object is to provide an inexpensive solid-state control for a relay which converts a composite multiphase current envelope into digital signals to resolve monitored current characteristics to a high degree of accurancy.

Still another object is to provide an overload relay control system which emulates the thermal characteristics of a circuit being protected.

It is a further object of the invention to provide a low cost means for an overload relay or similar circuit interrupter which can monitor plural phases without the need for signal multiplexing or utilizing redundant signal processing paths.

SUMMARY OF THE INVENTION

Briefly stated, in accordance with one aspect of the invention the foregoing objects are achieved by providing a plurality of current transformers, connected in delta, for picking up current signals in various phases of the system being protected. A trio of amplifiers coupling the intersections of the transformers to a comparator, while the other input of the comparator has a ramp signal applied to it at a desired sampling frequency. The comparator outputs a square-wave pulse whose duration is a function of the sensed magnitude of the half-wave rectified current envelope. In a preferred embodiment of the invention the ramp signal exhibits an exponential curve, or declining rate of rise, and the duration of the square wave pulse is exponentially related to sensed current. Periodically-obtained sample signals are accumulated in a register or accumulator after having a threshold value subtracted from them. The threshold value comprises a first quantity which varies with a phase imbalance and a second value which is a fraction of the preexisting accumulator contents. In the event of an overcurrent condition the accumulator overflows and produces a trip signal. The accumulator contents are then decremented in a manner which represents the cooling of the protected circuit elements.

BRIEF DESCRIPTION OF THE DRAWINGS

While the specification concludes with claims particularly pointing out and distinctly claiming the subject matter which is regarded as the invention, it is believed that the invention will be better understood from the following description of a preferred embodiment taken in conjuction with the accompanying drawings in which:

FIG. 1 is a functional schematic diagram illustrating the operation of a system utilizing the present invention;

DESCRIPTION OF A PREFERRED EMBODIMENT

Figure 3:
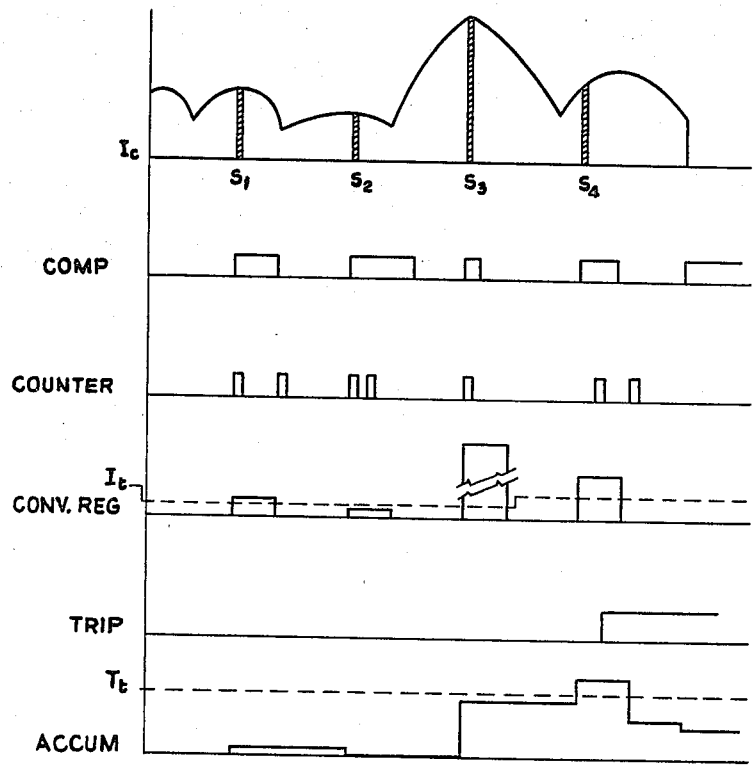
FIG. 3 represents waveforms at various points in the system of FIG. 1.

In the embodiment of the invention which is shown in the functional schematic diagram of FIG. 1, an electric circuit including conductors 10 is protected by means of an interrupting mechanism, here shown as a contactor comprising contacts 11 and an actuating coil 12. Current is applied to the actuating coil by an output relay including contacts 13 and coil 14. Coil 14 is in turn energized by a driver stage 15, herein functionally depicted as AND gate. Alternating load current $I_c$ flowing through the conductors is sensed by current transformers CT1, CT2 and CT3. The signals outputted by the current transformers are processed by a suitable circuit, herein shown as rectifier stage 16, to provide a single rectified AC current signal which is supplied to an analog-to-digital converter 17 which includes a comparator 18. As will be more fully described hereinafter, rectifier stage 16 is connected between a point of reference potential $V_r$ and an input terminal of comparator 18. The polarity of the rectifier stage opposes the reference voltage, and the maximum voltage output of the rectifier stage is substantially the same as the reference voltage so that an inverse relationship is established betweenn the rectifier output and the voltage signal applied to the comparator. The other input of comparator 18 is constituted by a ramp-like waveform 20 which may generally described as a monotonically changing voltage value and which is produced by a ramp generator 21. Signals at a sampling frequency $f_s$ from a pulse generator CLK periodically reset the ramp generator to begin a new sampling cycle. The pulse train also passes through AND gate 15 for maintaining coil 14 in an energizing state.

As will be more fully explained hereinafter the change in state of the output of comparator 18, shown herein as a square waveform 22, is applied to a digitizer 23 which may take the form of a 4-bit counter. The counter is caused to output a second, digital signal comprised of pulses on lines 24, the digital signal resolving the value of the level of current in conductors 10 into 16 discrete steps. The digital signal is applied to the inputs of a conversion register 25. The register, which in a preferred embodiment is a read only memory (ROM), serves to transform the four-bit current signal into third, current level signals in response to the applied digital signal. The third signal, denominated $I_i$, has a digital value which is a nonlinear function of the second signals received from counter 23 and may comprise an 8-bit digital word. The digital current signal $I_i$, which in the present nomenclature represnets the ith sample of current, is applied to one of two signal paths by means represented as switch 26. A counter 27 outputs control pulses which coincide with, but are at a lower frequency than, the sampling frequency $f_s$. In this manner, depending upon the setting of counter 27 by its "Trip Class" input, every nth current sample signal is directed to the lower signal path; the balance of $n-1$ sample signals are applied to the upper path, as shown. $I_i$ is transmitted to an arithmetic processing stage 28 such as a counter which is supplied with a value corresponding to a desired current threshold $I_t$. The current signal $I_i$ is added algebraically to the threshold value $I_t$ and the difference, which may be positive or negative, is loaded into an accumulator 29 which may be a counter, shift register or similar device.

A digital representation of the current sample is also applied to a decoder 32, which in turn drives an annunciator stage, here shown as LED1. While the digital signal may be derived at various points of the system in a presently preferred embodiment the four-bit signal from counter 23 is used.

Accumulator 29 continually sums the current signals from unit 28. Positive-valued signals, indicating an overcurrent, increase the value of the digital signal stored within accumulator 29 while negative-valued signals, representing current below the threshold value, are subtracted from the accumulated sum. The content of accumulator 29, corresponding to an accumulated digital count, is fed back through a dividing stage 30 where it is divided by a factor Q, and thence to a summing node 31 and used to establish a current threshold value $I_t$. In this manner the net current threshold level will reflect the thermal history of the load device as manifested by current flow and te content of the accumulator will stabilize at a level which approximates full load current in the presence of normal current levels.

When the sensed current level is too great the accumulated value exceeds the accumulator trip threshold, as established at comparator 38, and the accumulator in effect overflows and causes a TRIP signal to be produced. The TRIP signal is applied to AND gate 15 for disabling it and preventing pulses from CLK to be transmittal for energizing coil 14. Contacts 13 then open, deenergizing coil 12 and opening contacts 11. At the same time accumulator 29 is decremented in a manner to be explained hereinafter. If an overcurrent condition occurs when the current has been flowing for only a short period, the contents of accumulator 29 will not have attained their stabilized level and it will require a longer period for a given overcurrent to cause a trip than would be the case if the accumulator contents had already built up to the stabilized value.

The current signals which are not diverted to the lower, or overcurrent, signal path are applied by switch 26 an arithmetic unit 35 and tested to determine whether they satisfy the inequality $P\,I_{i-1} \leq I_i \leq (1/P)\,I_{i-1}$ in order to detect samples which deviate from each previous sample $I_{i-1}$ by more than a given percentage. Signals whose values do not satisfy the inequality increment counter M, while those signals which satisfy either side of the inequality, i.e., which deviate from the preceding ones by more than the desired bandwidth, increment counter J. Counter M and each section $J_1$ and $J_2$ of counter J produces an output when it is filled, counter M having a substantially larger content than the J counter. If counter M is filled first, it outputs a signal which resets both itself and all sections of counter J. On the other hand, if a section of counter J is filled before counter M, representing a predetermined incidence of fluctuation in current level, a signal is outputted which changes either or both the current threshold values $I_t$ and trip threshold $t_t$.

It will now be understood that for a relatively high incidence of out-of-tolerance current signals, counter section $J_1$ will be filled before counter M can overflow and output a reset signal. The output of counter stage $J_1$ is added to the fed-back "thermal memory" signal from accumulator 29, causing current threshold $I_t$ to be lowered and increasing the net value $(I_i - I_t)$ which is applied to accumulator 29. This has the effect of causing the current-related signals to be accumulated at a substantially constant rate despite an imbalance between phase currents, or other distortion of the circuit waveforms.

In like manner should the population of out-of-tolerance current signals in a given sample be still greater, indicating a still more unbalanced or even single-phased situation, counter segments $J_1$ and $J_2$ will both be filled before main counter M outputs its reset signal and accordingly, a still larger value will be applied to summing node 31 for decreasing threshold signal $I_t$ still further. This provides further compensation and maintains the rate at which current signals are accumulated for a given level of circuit current flow, and also maintains the point at which the accumulator content will stabilize in the absence of an overcurrent condition. In this manner the system is caused to maintain its sensitivity to overcurrent conditions despite varying degrees of current imbalance.

Figure 2:
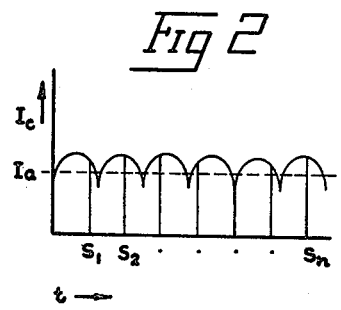
FIG. 2 illustrates a load current waveform.

Although the present invention may be used with single-phase systems, it is anticipated that it will most commonly be used with three-phase current. As is well known by those skilled in the art, half-wave rectified three-phase current exhibits a regular ripple configuration, as shown in FIG. 2. The duration of each of the regular waveforms is substantially 120° of the full cycle of each phase waveform. Although it is easily within the skill of the art to filter the rectified current and reduce the ripple therein in order to provide a practically constant current level which is representative of current flow in the circuit, the present inventor has found that this approach is actually undesirable when used with a sampling system of the type described. In the preferred embodiment a rectifier stage is provided which is of a type which ensures that significant ripple will be present in the rectified waveform. The average current value $I_a$ is indicated on the vertical coordinate of the graph, the horizontal coordinate denoting time. Current $I_c$ is sampled at a rate $f_s$, the sample points being indicated as S1, S2, ... Sn in the figure. For reasons to be more fully explained hereinafter it is important to the proper operation of the invention that sampling occur asynchronously with the alternating current Ic, that is, that the sampling frequency $f_s$ not be a harmonic frequency of triple the frequency f of the circuit current $I_c$ in any phase. "Harmonic" as used herein should be taken to mean harmonic frequencies which are both above and below 3f.

It will be understood that individual samples do not for the most part produce a signal truly indicative of average current value $I_a$. Moreover, due to the error inherent in any system and particularly due to the fact that only discrete, predetermined current value signals can be outputted by conversion register 25, it will be appreciated that a single sampling of the current such as occurs at time S1 will produce a signal which is only an approximation of actual sampled instantaneous, average, RMS, or other current value which is sought. However, by taking a large number of samples at irregular points on the waveform the errors which occur due to the discrete signal levels in the signal processing system are effectively nulled out, and the accuracy of the system greatly enhanced.

The operation of the system depicted in FIG. 1 will now be discussed in further detail, with reference to FIGS. 1 and 2 and to the signal waveforms depicted in FIG. 3. The alternating current $I_c$ flowing in conductors 10 induces similar signals in current transformers CT1, CT2 and CT3 which are applied to rectifier stage 16. The rectifier stage outputs a signal which constitutes an envelope of the half-wave rectified 3 phase currents in conductors 10. Here it should be pointed out the time constant of the ramp-like comparison signal 20 is far less than that of the frequency of the line current being sampled. Referring to waveform $I_c$ of FIG. 3, sampling periods S1–S4 are shown superimposed thereupon. For clarity of explanation these are shown in idealized form and at a lower frequency than actually required, and it will be recognized that the duration of the samples themselves is small with respect to the period of the waveform $I_c$ so that the sampling may be considered almost instantaneous in nature. At the beginning of each sampling period, the reference voltage from ramp generator 21 is low with respect to the sampled signal from rectifier 16, and the output of the comparator goes "high." Signal 20 continues to increase, however, until it either equals the value of the signal from rectifier 16, at which point comparator 18 changes state and goes "low," or until the ramp generator is reset at the end of the sampling time. In a preferred embodiment utilizing programmable digital means, frequency $f_s$ corresponds to the cycle time of the operating program. It will be appreciated that the lower the voltage signal from rectifier 16, corresponding to a higher value of circuit current $I_c$, the closer it will be to the initial value of the ramp generator output and accordingly the shorter the time will be which is required for ramp signal 20 to reach that value. Hence, the shorter will be the period that the output of comparator 18 is "high" and the shorter the duration of output pulse 22.

Digitizer 23, which in a discrete embodiment may be a commercially-available register or four-bit counter, produces no output signal in the absence of a positive or "high" signal at its input terminal. The occurrence of a "high" level pulse 22 from comparator 18 effectively enables counter 23, so that it outputs pulses representing up to 16 different binary numbers. The outputted signal comprises a set of digital pulses whose value is determined by the duration of pulse 22. In this manner the current sensed during a sample period is represented by a digital signal which is a function of current value. By using a nonlinear reference waveform 20 such as an exponential curve a nonlinear relationship is established between the level of sensed current and the digital signals which represent it, and in this manner a constant resolution of the sensed current is maintained. More particularly, the early or fast-rising portion of waveform 20 coincides with the higher-valued levels of current which are being sampled. Due to the steep slope of the sampling waveform during the initial part of the sampling period a rather small differential in time, or equivalently a small output pulse width, corresponds to a relatively large sampled current. Conversely, lower-valued current samples give rise to longer COMP output signals, whose durations are determined by the latter portion of waveform 20 which has a much lesser slope and therefore small deviations in current value result in disproportionately larger changes in the duration of the resulting COMP pulse. The pulse-generating system is therefore considerably more sensitive to current levels for lower values of sampled current than for higher values. By providing a sample waveform 20 of a generally exponential characteristic, the inventor has found that the resolution, or ratio of system sensitivity to sampled current value, can be held substantially constant. This in turn allows the system to monitor currents over a wide range of values without sacrificing accuracy.

As described above, the total excursion of the rectified signals from the current transformers is in effect compressed into a voltage range of $V_r$ in a manner such that a high sensed current produces a very low voltage, while a very low value of sensed current gives rise to a signal whose magnitude approaches $V_r$.

FIG. 3 illustrates how the durations of the pulses outputted by comparator 18 are inversely related to the level of current $I_c$. The durations of the pulses in the Figure is exaggerated for purposes of illustration. It is anticipated that the time duration of the pulses outputted by comparator 18, and indicated at the COMP line of FIG. 3, will be no greater than the duration of the sample time and in most instances somewhat less although when current envelope value remains high the comparator output may be continuously held in its "low" state. The first COMP pulse is somewhat shorter than the second, corresponding to the greater magnitude of the composite waveform during sample S1. For sample S3, however, current $I_c$ has increased substantially; hence the COMP pulse is substantially shorter in duration. At sample S4, current $I_c$ has diminished from the value of sample S3 but is somewhat greater than that of samples S1 or S2. Accordingly, the fourth COMP pulse has a duration less than the first and second pulses. The COUNTER pulses shown on the third line of FIG. 3 occur at substantially the same time as the COMP pulses. It should also be noted that although depicted as serial, COUNTER pulses occur simultaneously on four output lines. The longer the COMP pulse, the higher the numerical value which the COUNTER pulses represent. With the present system, higher numerical values correspond to lower current values, and conversely.

With an economical four-bit counter or microcomputer, however, the maximum number of values which can be represented is 16. Conversion register 25, which may for instance be a read only memory (ROM) or the like, receives the binary COUNTER signal and responds by outputting a value which is assigned to the received four-bit signal.

TABLE I

| Count | Assigned Value |
|---|---|
| 0 | 255 |
| 1 | 192 |
| 2 | 145 |
| 3 | 109 |
| 4 | 82 |
| 5 | 62 |
| 6 | 47 |
| 7 | 35 |
| 8 | 27 |
| 9 | 20 |
| 10 | 15 |
| 11 | 11 |
| 12 | 9 |
| 13 | 6 |
| 14 | 5 |
| 15 | 4 |

In a preferred embodiment utilizing a programmable microprocessor, conversion register 25 comprises a simple look-up table programmed with values such as those in Table 1. Register 25 is constituted so that the percentage change between adjacent values is constant so that errors produced by the limited number of discrete values which are available are no greater at low current levels than at higher ones. The conversion register values thus exhibit an exponential relationship to the signals received from counter 24. This compensates for, or complements, the nonlinearity introduced by the use of nonlinear comparison signal 20 while maintaining signal resolution constant. It will be appreciated that while an analog output signal level is shown for conversion register outputs, in a preferred embodiment current level is represented by a number of binary pulses so that, for instance, the level of signal from register 25 is represented by a digitally coded number. It is considered to be within the ability of persons skilled in the art to select analog, digital or hybrid apparatus for practicing the present invention, depending upon the application to which it is put.

Returning to FIG. 1, counter 27 flips switch 26 so that every nth sample pulse is directed to the lower or "overcurrent" signal path, including arithmetic unit 28. The value of n depends upon which TRIP CLASS input of counter 27 is enabled. For a higher TRIP CLASS n becomes larger, corresponding to a lower rate of sampling by the overcurrent path, and the time required to trip the circuit increases. The TRIP CLASS inputs may for instance correspond to NEMA classes 10, 20 and 30 which require the device to trip a 600% overcurrent in 10, 20 or 30 seconds respectively. During the intervening n-1 pulses counter 27 causes switch 26 to direct current sample signals to arithmetic unit 35.

A threshold value $I_t$ is subtracted from the CONV REG signals produced by the conversion register 25 by arithmetic unit 28 so that the ultimate value outputted to accumulator 29 relfects the difference between each sample value and the threshold. The result, which may be either a positive or a negative quantity, is applied to accumulator 29 whose contents are represented in idealized form at the ACCUM line of FIG. 3. As the accumulator receives each current-related signal from conversion register 25 it stores the signal, adding it algebraically to signals produced during previous sampling periods. In addition the fed-back "thermal memory" signal increases, adding to the current threshold value $I_t$.

It will be recognized that lower levels of current $I_c$ produce relatively small CONV REG signals and result in small, or negative, increments in the accumulated value ACCUM; while large values of current produce larger CONV REG signals resulting in increases in the accumulated signal such as that which occurs at the time of sample S3. While the ACCUM signal level in accumulator 29 is represented in analog form, it will be recognized that the retention and adding of such signals can be accomplished in various ways. The accumulator could, for instance, be a capacitor which stores charge from supplied signals; or, as in a preferred embodiment, a RAM memory which receives sequential, digital signals in which case the cumulative value of eight-bit word signals is represented by the vertical height of the ACCUM curve.

If the ACCUM signal exceeds a second, trip threshold value $T_t$, a TRIP signal is produced by comparator 37 which causes contacts 11 to open. In practice the original TRIP signal is small in magnitude and must be amplified by one or more amplifying stages. As soon as the TRIP signal effects the opening of contactor 11 current flow ceases. The sampling activity continues, however but since $I_i$ is zero the quantity $(I_i-I_t)$ is negative and accumulator 29 is decremented accordingly. The TRIP signal is fed back to TRIP CLASS counter 27 to effect a decrementing of the accumulator at a desired rate, and is applied to TRIP SELECT unit 37 to reduce the trip threshold $T_t$ to a lower value.

In a presently preferred embodiment the accumulator is decremented in twp steps; a first, one-step decrement by which a number of the magnitude of half the accumulator contents is substracted from the accumulated sum; and a second, slower decrement in which the balance of the numerical value stored by the accumulator is gradually depleted at a rate which approximates the dissipation of current-generated heat from a load. This step can readily be effected with discrete components such as counters which serve to "dump" a fixed amount of memory, and subsequently count down the remaining memory in a predetermined time. In the presently preferred embodiment, however, this function is easily carried out by instructing a central processing unit to "dump" a portion of the accumulator contents and to decrement the balance as described above.

The effect of the incrementing/decrementing operations on the accumulator is to in effect provide a "thermal memory" whose tolerance for an overcurrent condition depends upon the value and duration of current flow in the circuit. When current first begins to flow in the circuit the accumulator is "empty," that is, it has not accumulated any current signals and therefore a relatively high overcurrent can be tolerated for a period of time. Eventually, as the current samples increment the accumulator the value stored within it will approach the TRIP level and if the overcurrent condition continues a trip will occur. However, if current subsides to 100% load current or less the accumulator contents will stabilize at a value below the TRIP threshold. This characteristic permits a large flow of current to occur upon startup, when the load is presumed to be cold and can tolerate the overcurrent condition.

After the system is stabilized and the accumulator contents have achieved a constant level, less overcurrent can be tolerated. Due to the now-existing level of current signals, only a relatively small increment is needed to cause the accumulator to produce a trip signal. This corresponds to the reduced tolerance of an operating-temperature load to overcurrents.

After the system has tripped, the accumulator is decremented in a stepwise manner so that as time passes the accumulator can accept a larger and larger overcurrent signal without causing a trip to occur. Therefore, immediate reclosing of the interrupter contacts is tolerated only if the resulting current flow is low. Higher current values require a longer time delay before reclosing in order to allow the accumulator to be sufficiently decremented. This corresponds to the time delay required to allow the circuit load to cool down to a point at which the higher current can be tolerated.

In addition to detecting an unduly high level of current in the system being monitored it is highly desirable to be able to detect an imbalance between currents of different phases. Should one phase of a load become open-circuited, for instance, the average value of the rectified current could diminish and a system responsive only to overcurrent would not respond.

Phase imbalances are normally detected by differential sensing systems which measure the difference in current flow between phases. With the present invention, however, signals from the current transformers for different phases are added together and treated as a continuous, single signal. This technique affords the advantages of economy and simplicity, allowing the use of a single signal channel without the need for multiplexing or other techniques which increase the complexity, size and cost of the system. However, it is necessary to recognize phase imbalances and to adjust the activity of the system accordingly. The present invention achieves this end by reacting to the statistical frequency of rapid excursions of the composite waveform, rather than by the conventional approaches of comparing maximum or average current values of different phases or by measuring the absolute value of a waveform at sampling times.

Referring again to FIG. 1, the output of the conversion register 25 comprises a weighted current signal $I_i$ for each ith sample. In comparator 35, each ith sample is compared with a preceding sample designated $I_{i-1}$ according to the following inequality:

$$PI_{i-1} \leq I_i \leq (1/P)I_{i-1}$$

By manipulating the value of P the sensitivity of the system can be adjusted so that the amount of deviation of each successive current sample from its predecessor can be sensed. In a successfully-tested embodiment a value of P of 2 was utilized. It will be recognized, however, that this value may be varied depending upon the specified application of the system and the adjustment of other system parameters. With the preferred peak-to-trough ratio of 2, however, utilizing a P-value of 2 matches the above inequality to the anticipated waveform. For values of P close to 1, the system is extremely sensitive to excursions in current; whereas as values of P increase, the system becomes less sensitive. For current values which do not satisfy the inequality, indicating an acceptably small current change, the M counter is incremented. On the other hand, should the value of current satisfy either side of the inequality it is understood that an unduly large change in current has occurred and the J counter is incremented. The acceptable maximum counts, or overflow points, of the J and M counters determines the amount of current imbalance which the system will tolerate. The number of samples required for overflow of the M counter is substantially greater than that of the J counter; if the M counter overflows before the J counter, it simply resets both itself and the J counter and the process begins once more. However if the population of rapidly-changing current samples is greater than a percentage determined by the various J counts divided by the maximum M count corresponding to a 20% phase imbalance, the $J_1$ counter overflows first and outputs a signal to summing point 31 for lowering the current threshold $I_t$. If the J counter continues to be incremented and the M counter does not overflow ultimately the $J_2$ section will overflow and produce a second control signal, indicating a 40% imbalance. This signal is applied to both the summing point 31 and threshold selector 37, and causes both the current and trip thresholds to decrease. In the presently-preferred embodiment an overflow count ratio of 255 to 100 for the M and total J counters, respectively, was found appropriate.

A separate select switch or similar mechanism may be provided to select one of several current threshold values to be actuated, for example to accommodate more extreme cases of imbalance, approximating single phase operation. The precise amounts by which the current and/or trip thresholds are manipulated as well as the number of counter sections or steps which are selected are determined emperically in view of the system variables, the specific type of digital or other coding selected, and of course the external system being monitored. A relatively high percentage of sudden fluctuations, without regard to the magnitudes thereof, is deemed to be indicative of an unbalanced load, or as an extreme case, single-phase operation. By adjusting the proper relationship of overflow capacity in the M and J counters, a predetermined degree of current unbalance can be addressed. Further, the system is readily adaptable for use with single-phase systems since no physical changes need be made.

By a judicious control of the current threshold anbd tripping threshold quantities, it has been found that the instant system can be rendered responsive to varying degrees of current imbalance. In one embodiment, the trip threshold value $T_t$ was diminished by 30% when 40% unbalance and single-phase conditions were sensed, while the current threshold value $I_t$ was reduced by 20% for a 20% unbalanced condition, and by 68% for 40% unbalanced and single-phase conditions. Although these responses may be preset by means of appropriate hardware such as counters, registers and logic gates, in the presently preferred embodiment the various responses are executed in the form of programmed responses produced by appropriately programming a commercially-available microcontroller of the type described.

Figure 4:
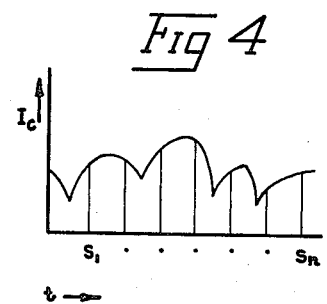
FIG. 4 illustrates a composite current waveform in an unbalanced multiphase circuit.

FIG. 4 represents the composite circuit current envelope when an unbalanced phase condition is present. The overall waveform is distorted, and substantial changes occur from one sampling period to the next. Such substantial changes, occurring in a relatively short time, produce differences between sampled signals sufficient to increment the J counter of FIG. 1 and ultimately cause the value of the current threshold to be lowered in order to compensate for the changed current characteristics. In this manner the illustrated system can detect unbalanced phase conditions, including single phase operation, without the need for separate detection or signal processing equipment and without using differential signal processing by making use of current signals which are already generated within the system.

A significant feature of the present system comprises means for indicating an impending trip condition, that is, the existence of a marginal overcurrent condition which is not yet sufficient to cause accumulator 29 to produce a TRIP signal. In the preferred embodiment which is depicted, the value of each current sample $I_f$ is initially represented by a four-bit binary number. In the present example the system is adjusted so that at 100% of SET current for balanced three phase operation this value is 7. Using standard binary coding, for values of less than 7 binary 1's appear only in the last three bits of each word. A binary 1 does not appear in the most significant bit until it is necessary to designate the number 8 or above. Decoder 32 makes use of this effect by monitoring the most significant bit of each digital word and, when a binary 1 is absent, outputting a signal which momentarily energizes LED1. As explained above the current samples are taken at a non-harmonic frequency so that as average current exceeds a level equivalent to the set value LED1 begins to blink intermittently. As current increases (digital number decreases), a progressively greater percentage of current samples are recognized by detector 32 and the rate of blinking increases rapidly until at approximately 110% of set current LED1 stays on uninterruptedly. It will be apparent to those skilled in the art, however, that other means can be substituted for decoder 32 for recognizing signals indicating overcurrent, and that other forms of current-representing signals can be monitored. For instance, an eight-bit digital word representing the current sample value as outputted by conversion register 25 can be used.

This aspect of the depicted system is highly useful in practice as it allows an installer to know when system current has exceeded its set value, but before an actual trip takes place. In addition to providing a useful warning, this allows the installer to adjust the control settings to suit a particular application without knowing the actual value of current, and hence without the need for ammeters or other instrumentation. Once the system is installed and with normal load current flowing, the current set level is adjusted downwardly by increasing the gain of the rectifier stage until LED1 just ceases blinking. By appropriately calibrating the sensing stage gain adjustment, actual current flow can be determined.

Figure 5:
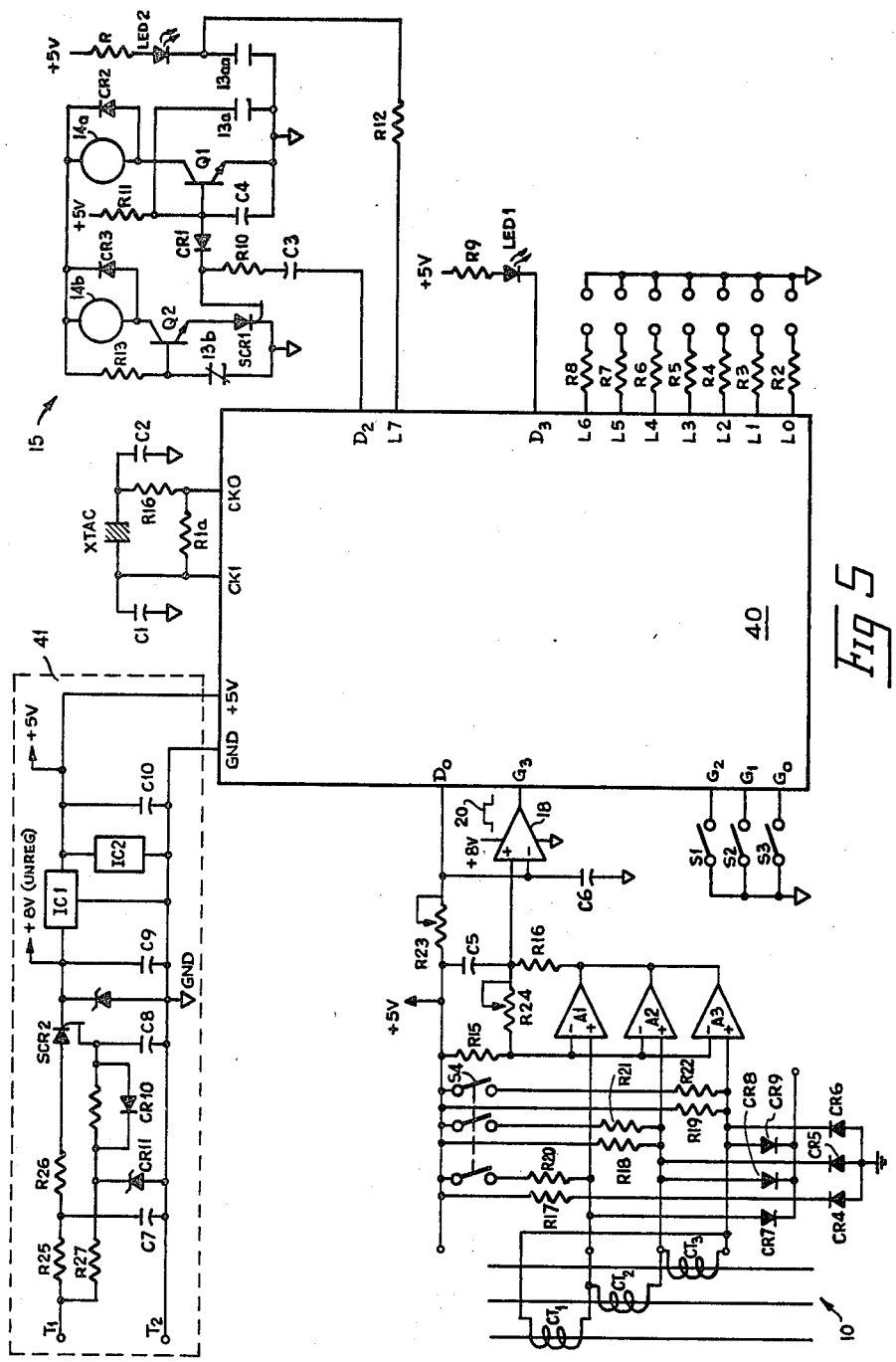
FIG. 5 is a schmatic diagram of a presently preferred embodiment of the invention.

FIG. 5 illustrates in further detail a presently-preferred embodiment of the invention in which many of the signal processing functions are carried out by a microcontroller. In a successfully tested embodiment a model COP402 microcontroller manufactured by the National Semiconductor Corporation of Santa Clara, Calif. was utilized in conjunction with a separate erasable programmable read-only memory although, of course, it is anticipated that as it is produced in large numbers it will utilize a custom read-only memory. The microcontroller, herein designated at 40, utilizes the external oscillator option recommended by the manufacturer including a resonant crystal XTAC and capacitors C1, C2. Resistors R1a and R1b are coupled across the crystal as shown. Resistors R2-R8 are coupled to microcontroller inputs $L_0-L_6$, respectively. A power supply circuit 41 providing a source of 8 volts and closely-regulated 5 volts is coupled between the GND and +5 terminals of the microcontroller. Switches S1, S2 and S3 are coupled between a point of reference potential and programming terminals G1, G2 and G3 for setting the status, or trip class, of the microcontroller. Switches S1-S3 and similar devices coupled to terminals $L_0-L_6$ may comprise individual jumpers or other easily manually-operated mechanisms which are accessible to a user of the apparatus for presetting the unit in accordance with field applications of the control, for instance, to allow or to prevent the resetting of the system subsequent to a trip or to tolerate a certain degree of imbalance in order to allow the unit to be used with single-phase current. One of the buffered outputs $D_3$ is coupled to a light emitting diode LED1 for enabling the diode in the presence of an overcurrent condition, when a trip is impending, thereby providing a visible indication of the state of the current monitoring system. As customary, LED1 is connected to a source of potential, here 5 volts, through a resistor R9. A second light emitting diode LED2 is provided for indicating a tripped condition.

The driver circuit indicated at 15 of FIG. 1 is more fully disclosed in FIG. 5, the quiescent or "no trip"

output being a pulse train 42 which is AC coupled from terminal D2 by capacitor C3 and a resistor R10 for operating a relay set winding 14a and reset winding 14b. Current for the set winding flows through transistor Q1, whose base is isolated from "no-trip" pulse train 42 by diode CR1. The base is coupled to a source of reference potential through capacitor C4 and to a source of bias potential through resistor R11. A clamp diode CR2 is coupled in shunt about winding 14a. A further set of contacts 13 (FIG. 1) are also operated by winding 14a. The normally-open contacts 13a and 13aa are coupled so that contacts 13a shunt capacitor C4, and contacts 13aa lie between a light emitting diode LED2 and ground. The cathode of LED2 is further coupled to terminal D5 of the microprocessor by resistor R12, providing a feedback path for indicating the state of the relay to microprocessor 40.

The reset winding 14b has another diode CR3 coupled about it, and lies in series with second transistor Q2. A gated device such as thyristor SCR1 couples the emitter terminal of Q2 to a point of reference potential while normally closed contacts 13b lie in series with a resistor R13.

In operation, when the system is monitoring normal current flow a train of pulses 42 is constantly produced at terminal D2. The pulse train biases SCR1 into conduction so that reset winding 14b is energized, causing contacts 13b to be closed. Diode CR1 conducts the negative-going edges of pulse train 42, discharging capacitor C4 and maintaining the base terminal of transistor Q1 at a low voltage level. This ensures that Q1 will not be biased on by the 5 volt supply connected through resister R11. When a TRIP signal occurs, pulse train 42 stops and the gate signal is removed from SCR1. At the same time capacitor C4 charges, enabling transistor Q1 and energizing winding winding 14a. This causes contacts 13 to open cutting off current flow through winding 12 and opening contacts 11. At the same time contacts 13aa are closed to complete a circuit through LED2, which lights to indicate a "tripped" condition and a ground or zero voltage is applied to input terminal D5, informing the microprocessor that a "tripped" condition exists.

As explained with respect to FIG. 1 a circuit current Ic, conventionally a three-phase current, flows through conductors 10 to which are coupled a set of current transformers CT1, CT2 and CT3. The transformers are in turn coupled to three corresponding differential amplifiers A1, A2 and A3. A network of burden resistors R17, R18 and R19 connect the first ends of the current transformers to a source of reference voltage, herein 5 volts. A second set of resistors R20, R21 and R22 are coupled in parallel with resistors R17, R18 and R19 respectively by means of a range switch 54 so that the effective resistance between the positive-terminal lines of each amplifier and a point of common potential can be modified to adjust the current sensing range by, for instance, a factor of 10. Resistor R15 couples a 5 volt bias to the negative inputs of the amplifiers while resistor R16 couples their outputs to comparator 18. Current flow for charging capacitor C6 is controlled by resistor R23. Capacitor C5 stabilizes the amplifier outputs while resistor R24 serves as a common feedback path and gain control for the amplifiers. A first set of diodes CR4-CR6 clamps the input leads to amplifiers A1-A3 to ground, while a second set of diodes CR7-CR9 clamps the leads to a +5 volt level so that the input voltage to the amplifier is constrained between −0.7 and +5.7 volts.

As stated above, amplifiers A1, A2 and A3 function as half-wave rectifiers so that a waveform is produced consisting of repetitive halfwave signal so that when combined each phase contributes a 120° portion of the output waveform and hence exhibits a high ripple factor. In the presently preferred embodiment a peak-to-trough ratio of 2 is desired. An increase in detected current produces a negative-going waveform at the output of the appropriate rectifying amplifier. The star connection of burden resistors R17, R18 and R19, and the connection of amplifiers A1, A2 and A3 thereto assures that the most negative of the three signals will dominate, each amplifier thus being operational for 120° of each cycle for balanced conditions. The rectified, negative-going signal derived from the amplifier circuit is applied through resistor R16 to the positive input terminal of comparator 18. There is thus placed across the inputs of comparator 18 a negative-going voltage which biases the positive terminal downwardly, in effect lessening the threshold voltage for the ramp signal 20 derived from capacitor C6. Accordingly, the further negative the bias on the positive terminal of comparator 18, the sooner the comparator will switch to its "high" state as the ramp waveform increases. A relatively large (low) voltage on the positive terminal will cause the comparator to return to its "low" state rapidly, after the ramp has decayed toward its quiescent level by only a small amount. Hence, the duration of the "high" state of the comparator will be short. This corresponds to a short comparator output pulse 20. At the same time, a small (slightly negative) signal from the amplifiers will bias the comparator only slightly, so that ramp must approach its maximum level before the comparator will switch from a "high" to a "low" state. This has the effect of extending the duration of output pulse 20, and in this manner the duration of the output pulse is constrained to be an inverse function of the level of current sensed by the current transformers. Depending upon the sensing frequency $f_s$, in this case representing the cycle time of the operating program of microcontroller 40, after some period of time has elapsed a negative-going reset pulse will be outputted by the $D_o$ terminal of the microcontroller for discharging capacitor C6 and re-starting the generation of a new ramp-like pulse 16.

It will now be understood that a sensed current having a relatively small magnitude produces a relatively large positive bias at comparator 18. This in turn causes the comparator to output a longer pulse width, changing state at a time when the slope of the exponential or ramp-like reference waveform is low and the resolution of the switching point is very accurate. For larger current values the bias on the comparator is considerably less and the comparator changes state rapidly, at a time when the slope of the reference waveform is steep. The steeper waveform slope decreases the resolution of the switching point in absolute terms but since the value of current is greater the resolution of current vlaue, equivalent to the percentage of error, is substantially constant.

It will be readily appreciated by those skilled in the art that many of the elements shown in discrete form in FIG. 5 could easily be provided by one or more integrated circuits, and for those applications in which the described system is produced in quantity it is anticipated that many amplifiers, transistors and resistors can be incorporated in a single custom integrated circuit.

Such embodiments of the system are deemed to be well within the skill and discretion of circuit designers.

In practice, microcontroller 40 functions in the manner described above, in effect incorporating the functional elements which are schematically shown in FIG. 1. The above-described functions and interrelationships are established by means of suitable instructions supplied to the microprocessor. In FIGS. 6 and 6a–6d there are shown the pattern of operation of the microprocessor in logical form, comprising flow charts setting forth the various parameters and instructions useful in practicing the present invention with programmable apparatus of the type referred to above.

While it is believed that the flow chart constituted by FIGS. 6a–6d is sufficient to allow those skilled in the art to program commercially-available microprocessors to function as described hereinabove, or to allow a skilled person to construct a functionally equivalent system from discrete components, some of which may be "programmable" in the sense of having variable parameters or response characteristics, a recapitulation of the system operation may be helpful.

As is the case with all such systems, the first step in its operation is to initialize all elements of the system, which includes ensuring that no flags or similar "alarm" signals are set, zeroing the values of various counters or accumulators and initialization or preloading counters with the necessary counts, for instance a particular value which is desired for the current threshold. A check is made to see if the TRIP feedback signal is set, which would indicate a "tripped" condition in which case the system is required to set flags indicating trip status. The trip class input is read, and enabled and a register corresponding to counter 27 set accordingly. A comparison routine is executed, first by fully discharging the capacitor of ramp generator 21, then isolating the capacitor to allow it to charge according to an RC time constant established by circuit elements. As the capacitor voltage increases, comparisons are repeatedly made and counter 24 incremented until a comparison is established at which time the current sample value is read. The register corresponding to counter 27 is then decremented. If the latter has not reached its "zero" state, a phase imbalance routine is executed which includes a comparison step which establishes whether the current sample $I_i$ fulfills the inequality $PI_{i-1} \leq I_i \leq (1/P)I_{i-1}$. As explained with respect to FIG. 1, current values which do not fulfill this inequality and thus do not deviate inordinately from the previous current sample value increment the balance register, or M counter, while those which do fulfill the inequality cause the unbalance register, or J counter, to be incremented. If the balance register has not overflowed and the unbalance register has not reached its first overflow point, the current threshold is not changed and current magnitude is tested against a set current value. If the balance register overflows a first, large current threshold value $I_{t1}$ is generated, and both the balance and unbalance registers are reset. Should the unbalance register have reached its first overflow point, which is less than the balance count, a somewhat smaller current threshold value $I_{t2}$ is set which in the current embodiment corresponds to a 20% imbalance. If the balance count is smaller than the unbalance count a 40% unbalance condition is present and a third current threshold $I_{t3}$ is set.

In a presently preferred embodiment an unbalance defeat function is provided wherein, in response to the application of a control signal (such as the closing of a switch) to one of the auxiliary control inputs $L_0$-$L_6$ a large sensed imbalance results in the production of a fourth current threshold value $I_{t4}$. As shown in Table II the value of $I_{t4}$ is greater then $I_{t2}$ or $I_{t3}$ and renders the system less sensitive to current imbalance. By properly selecting $I_{t4}$ the system can then be used to monitor single-phase current where rectified waveform envelope, of course, exhibits a higher ripple factor than does a comparable three-phase waveform.

TABLE II

| Imbalance | Current Threshold | | Trip Threshold |
|---|---|---|---|
| 0% | $I_{t1}$ | 15 | 31799 |
| 20% | $I_{t2}$ | 9 | 31799 |
| 40% | $I_{t3}$ | 6 | 11795 |
| (defeat) | $I_{t4}$ | 10 | 11795 |

Figure 6:
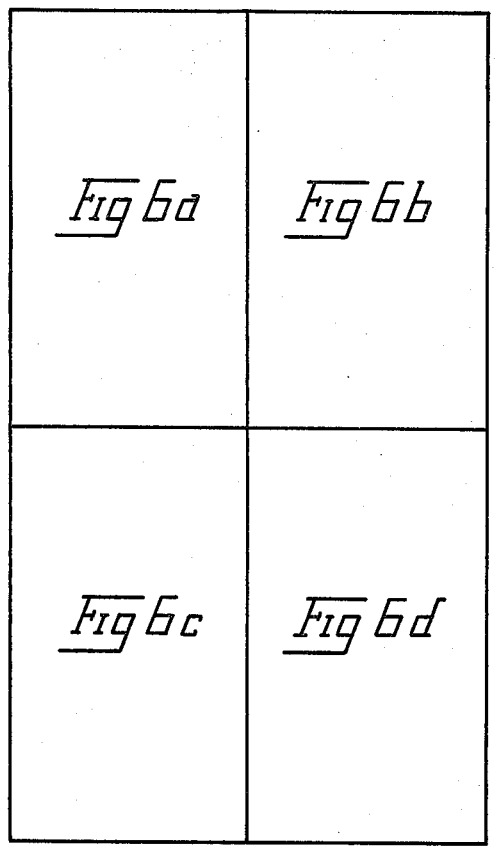
FIGS. 6-6d are flow charts illustrating the operation of the preferred embodiment of FIG. 5.
Figure 6A:
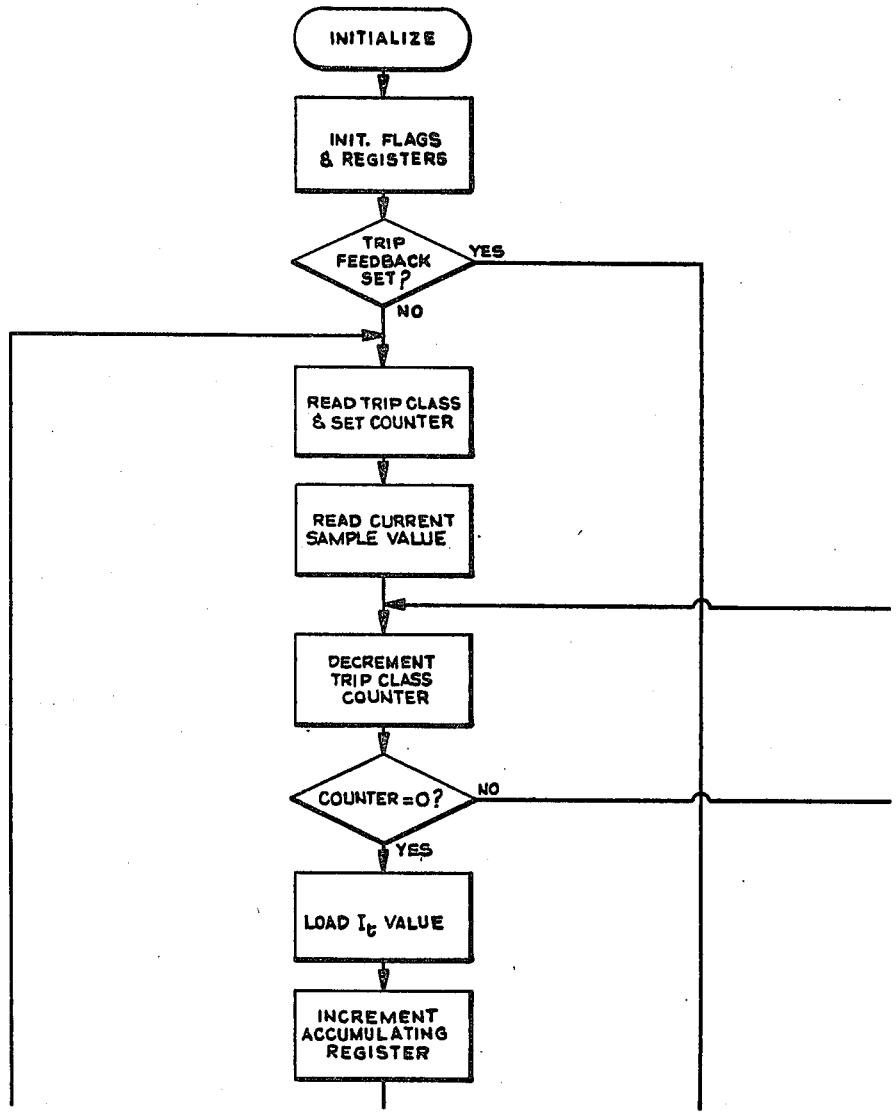
Figure 6B:
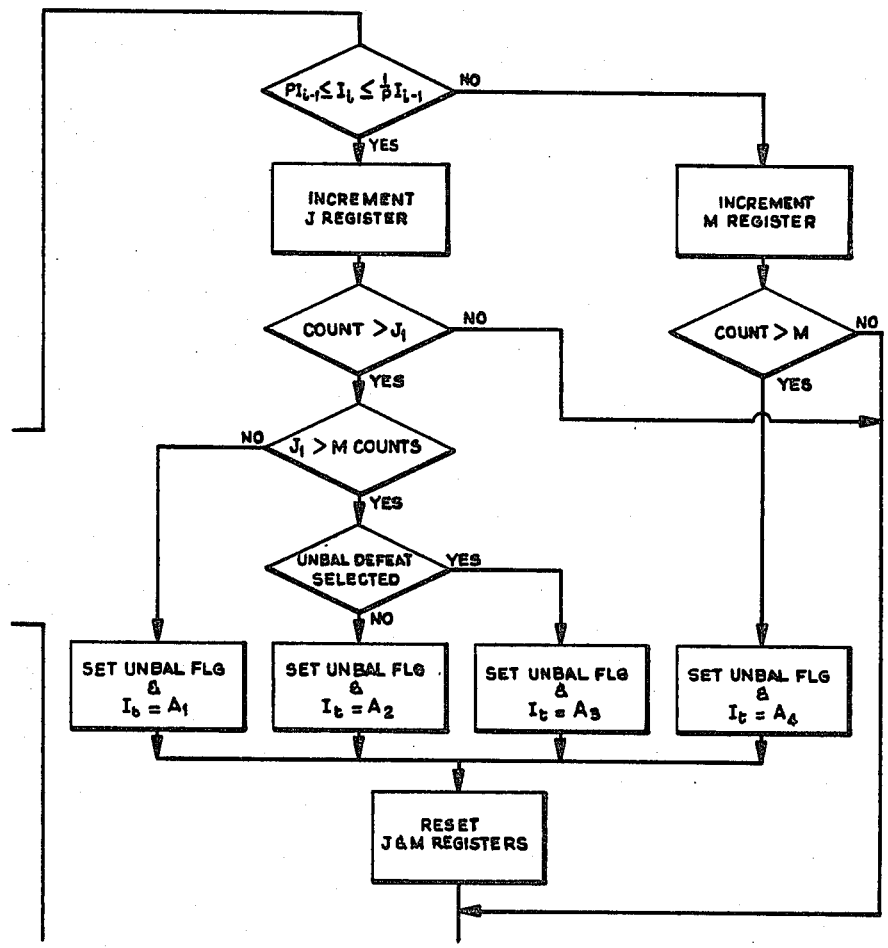
Figure 6C:
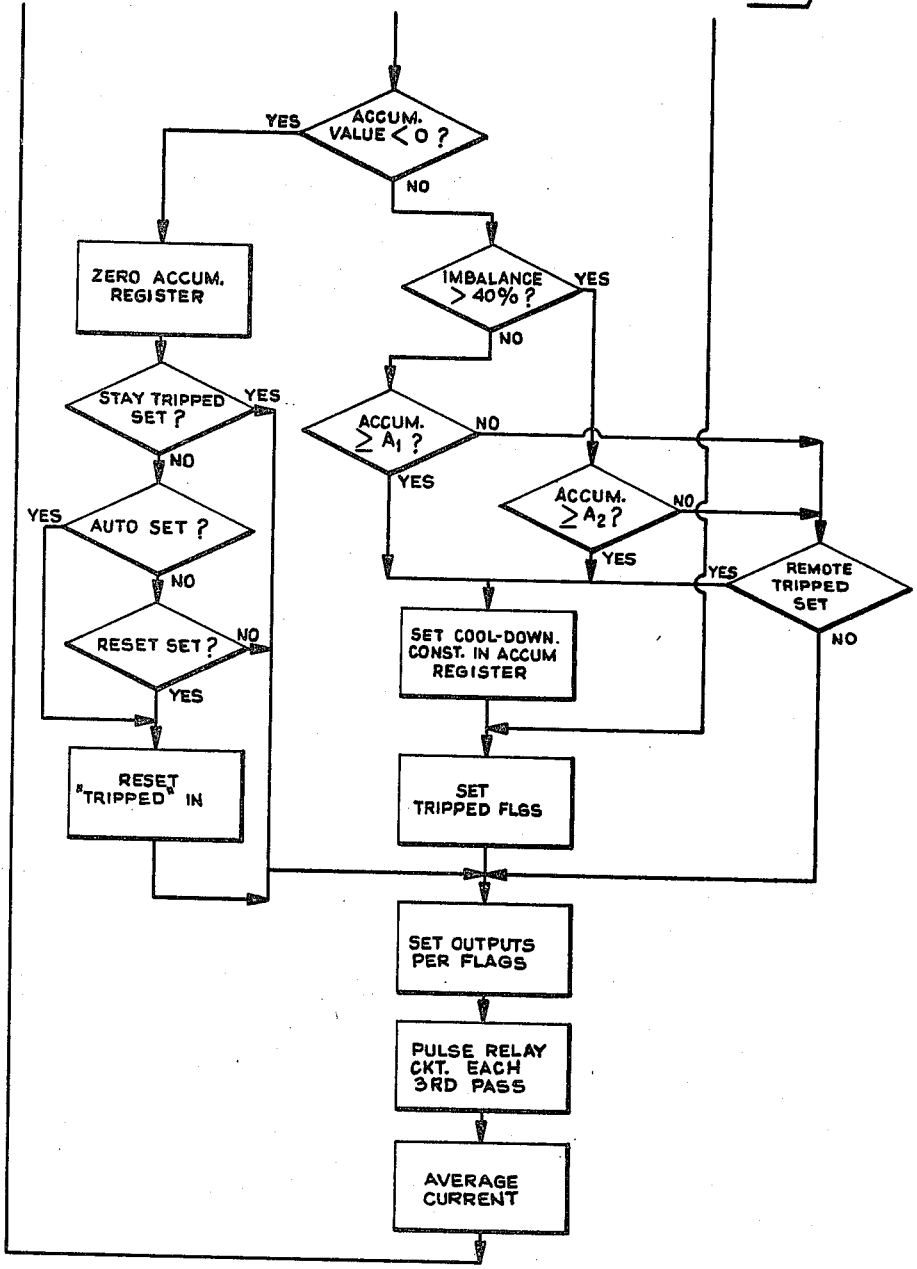
Figure 6D:
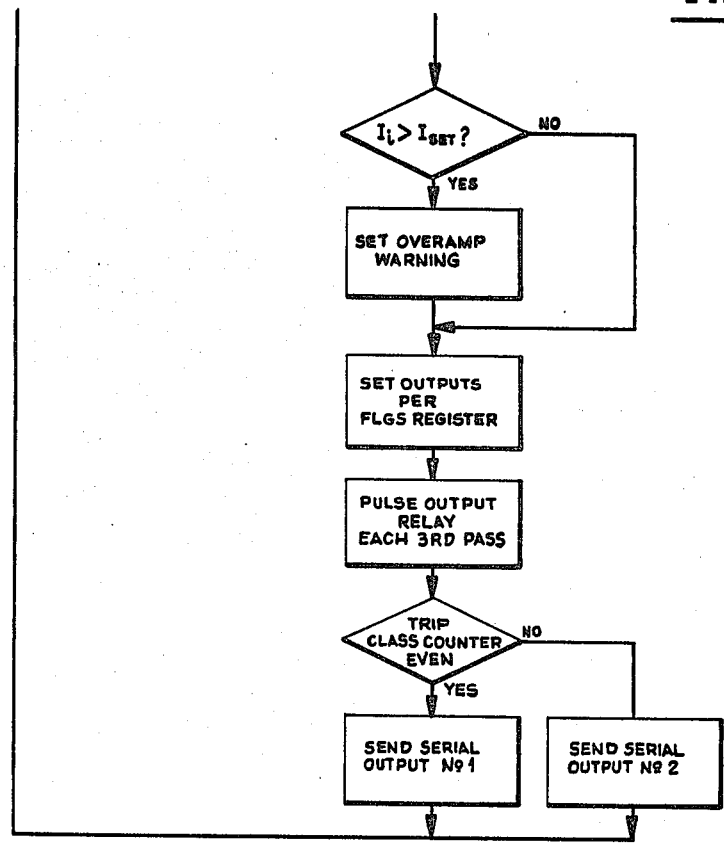

After determining the current threshold value, as shown in FIG. 6d the absolute value of the current sample is tested to see whether it exceeds the set current value; if so, the overamp alarm or "flag" is set for the next few system cycles, for instance four cycles. This corresponds to the energization of LED 1 in FIG. 1, the number of cycles which the LED is "set" assuring that the LED will remain lighted for some minimal time, long enough to be perceived by the human eye as an indication that "set" current value is being approached. The system next sets all outputs in accordance with the flags which have been set in an appropriate FLAGS register and on each third cycle a pulse is outputted to the relay energizing system 15. A serial output designated either No. 1 or No. 2 depending upon whether the bits accumulated in a register corresponding to counter 27 are even or odd, may then be sent to a remote monitoring or recording station.

Returning to FIG. 6a, the last-determined current threshold value is loaded and accumulator 29 is incremented to new value $A_i$. This value represents the previous accumulated value $A_{i-1}$ plus the latest current sample $I_i$, less the current threshold $I_t$ and the fed-back thermal memory value which consists of a fraction of the present accumulated value, represented as $1/Q * A_{i-1}$, or $$A_i = A_{i-1} + I_i - I_t - (1/Q)A_{i-1}$$

Factor Q represents an appropriate power of 2, which is dependent upon the maggnitude of the intended contents of the accumulation register and of the effect to be given the thermal simulation; in one successfully tested embodiment the value of 2048 was utilized.

If the value of the accumulation register is 0 or less, the register is zeroed and checks made to see if various optional status contacts, such as a "stay tripped" switch, "automatic reset", or a "reset" control, are set. These contacts which may be used to selectively enable a desirable various system function, may readily be provided by switches coupled to terminals $L_0$-$L_6$, as shown.

If the accumulator register has some constant, a comparison is made with a trip threshold $T_t$, whose value is dependent upon the degree of sensed imbalance. A lesser trip threshold is selected in the presence of current imbalance; for example, an unbalance-mode threshold which is approximately one-third of the normal, balanced-current threshold may be utilized. If the thresholds have not been reached or, to put it another way, if the accumulator has not overflowed, and no remote trip is called for, the control system proceeds to set its outputs in the usual manner. However, if the accumulator register overflows, or if a remote trip is called for, the contents of accumulator 29 are dumped and an appropriate value corresponding to a "cooldown" constant is loaded into the register. This value is somewhat less than the overflow value for the register, and corresponds to an initial decrement. "Tripped" flags are set, and subsequently all system outputs are set in accordance with the flags which have been established. On each third cycle a pulse is applied to the relay control system 15, and average current is determined by adding one quarter of sample Ihd i to ¾ of the previously-established average current value. The system is then recycled as shown.

While a successfully tested embodiment made use of model COP402 National Semiconductor Corporation microcontroller, it will readily be recognized by those skilled in the art that the present invention may be practiced with many other programmable devices which have equivalent or greater capabilities. The model COP402 device may briefly be characterized as having 12 bidirectional I/O ports, although it will be noted that only a few of such parts are utilized with the present invention; four general purpose outputs, a serial input and output, and a logic controlled clock. Program memory consists of a 512 byte PROM, which is addressed by a 9 bit register. Data memory consists of a 128 bit RAM which is organized as four data registers of eight 4 bit digits. Of course, more complex units can readily be substituted for the microprocessor described, although with a corresponding increase in cost of the control system.

As will be evident from the foregoing description, certain aspects of the invention are not limited to the particular details of the examples illustrated, and it is therefore contemplated that other modifications or applications will occur to those skilled in the art. It is accordingly intended that the appended claims shall cover all such modifications and applications as do not depart from the true spirit and scope of the invention.

What is claimed as new and desired to be secured by Letters Patent of the United States is:

1. In a circuit protection device including switch means for opening and closing a multiphase electrical circuit, sensing means for sensing the current flow in the circuit and providing a signal representative thereof comprising
    a plurality of current transformer means for producing current-related signals, said current transformer means being connected in a delta configuration;
    a plurality of amplifiers each having a first input connected to a different one of the intersections of the current transformer means, and a second input terminal connected to a point of common potential;
    a comparator means having first and second inputs;
    means connecting the outputs of said amplifier means to one of the inputs of said comparator means; and
    ramp generator means for periodically applying a monotonically-charging reference signal to the other of the inputs of said comparator means in order to cause the output of the comparator to adopt a first value when the output of said ramp generator means exceeds the outputs of said amplifiers and a second value when the output of said ramp generator means is less than the output of any of said amplifiers.

2. The invention defined in claim 1, further including resistance means coupled between the first inputs of each of said amplifier means, and said point of reference potential.

3. The invention defined in claim 2, wherein the values of said resistance means are adjustable.

4. The invention defined in claim 3, further including a variable gain control resistance coupled between the second inputs and the common output of all of the amplifiers.

5. In a circuit protection device for monitoring three-phase current in an electrical circuit, sensing means for sensing the current flow in the circuit and outputting periodic signals at a frequency $f_1$ representing the magnitude of the composite current, comprising the combination of:
    a set of threee current transformers connected in a delta configuration;
    a set of three differential amplifiers, first inputs of said amplifiers being coupled to a point of reference potential, second inputs of said differential amplifiers each being coupled to a different one of the intersections between the current transformers;
    a comparator having an additive and a subtractive input;
    a signal generator for periodically providing a ramp signal coupled to the subtractive input of said comparator at said frequency $f_1$;
    means coupling the outputs of said differential amplifiers to the additive input of said comparator;
    whereby said comparator adopts a first state when of sensed current signal provided by the current transformers is less than the magnitude of the ramp signal and a second state when the magnitude of the ramp signal is less than the sensed signal, the duration of the change of state of said comparator being an inverse function of the magnitude of sensed current flow.

6. The invention defined in claim 5, wherein said ramp signal generator comprises the series combination of a resistor and a capacitor; and means coupling said resistor and capacitor to a point of bias potential.

7. The invention defined in claim 6, further including a common feedback loop extending about said differential amplifiers, said feedback loop comprising adjustable resistance means.

8. The invention defined in claim 7, further including second resistance means coupled between said first inputs of said differential amplifiers and said point of bias potential.

9. The invention as defined in claim 8, further including a capacitor coupled between the outputs of said differential amplifiers and said point of bias potential.

10. The invention defined in claim 9, further including
    first and second diode network coupled between the second inputs of said amplifiers and said point of bias potential and a point of reference potential, respectively; and
    a resistor network coupling said second inputs of said amplifier and said point of bias potential.

11. In a control system for detecting overcurrent conditions in an electrical circuit and including sensing means for deriving a signal representative of current flow and converter means for periodically outputting sample signals representing current flow;
    adding means for algebraically adding a threshold value to said sample signals;

accumulator means for accumulating the algebraic sums of said threshold values and sample signals;

feedback means coupled to said accumulator for deriving a thermal correction signal which is a function of the contents of said accumulator means and applying said thermal correction signal to said adding means for adjusting said threshold value; and means for producing an overcurrent; indication when the contents of said accumulator attain a predetermined level.

12. The invention defined in claim 11, wherein said feedback means derives a thermal signal which is a predetermined fraction of the contents of said accumulator means.

13. The invention defined in claim 11, further including means responsive to said overcurrent indication for decrementing the contents of said accumulator means.

14. The invention defined in claim 13, wherein said means for decrementing operator to decrement said register contents by a first, larger value and subsequently by successive, smaller values.

15. In a contact system for detecting overcurrent conditions in an electric circuit and including sensing means for deriving a signal representative of current flow and converter means for periodically outputting sample signals representing current flow, the method of accounting for the heating effect of current flow comprising the steps of combining each ith current sample $I_i$ with a current threshold value $I_t$ to produce a net current sample value;

accumulating said net current sample values in an accumulator, deriving a thermal correction signal from said accumulated signals to form at least a portion of said threshold value $I_t$ whereby net current values which are accumulated are caused to approach a maximum value which is not exceeded in the absence of an overcurrent condition; and producing an overcurrent indication when the accumulated net current values exceed said maximum value.

16. The invention defined in clalim 15, further including the step of deriving said thermal correction signal by dividing the accumulated net current values by a factor Q.

17. In a control sytem for responding to overcurrent conditions in an electrical circuit and including means for producing periodic digital signals representing current flow, the method of accounting for the heating effect of current flow comprising the steps of subtracting a thermal correction value from each of said periodic digital signals to produce periodic net current signals, accumulating said net current signals by adding successive ones of said signals to form an accumulated sum;

dividing each sum so produced by a factor Q to provide a thermal correction value to be subtracted from the next successive periodic digital signal so that the value of the accumulated net current signals stabilizes below a trip threshold value in the absence of an overcurrent condition; and producing an overcurrent condition indication when the value of the accumulated net current signals exceed said trip threshold value.

18. In a control for monitoring current flow in an A.C. circuit and selectively actuating protective apparatus therefor, and comprising sensing means for sensing current flow in the circuit and outputting digital sample signals representative thereof at periodic intervals which occur at a no-harmonic of circuit current frequency, counter means for receiving said sample signals and responsive to signals representing a current value above a predetermined level to output an energizing signal having a fixed time duration in response thereto; and annunciator means coupled to said counter means and energizable by said energizing signal to provide a momentary indication of overcurrent, whereby said annunciator means is enabled progressively more often as the average current value approaches said predetermined level and is enabled substantially continuously after the average current attains said level.

19. The invention defined in claim 18, wherein said counter means is enabled by the presence of a "1" bit at a predetermined position in said digital signal.

20. The invention as defined in claim 18, wherein said annunciator means comprises a light emitting diode.

* * * * *

UNITED STATES PATENT AND TRADEMARK OFFICE
CERTIFICATE OF CORRECTION

PATENT NO. : 4,423,458

DATED : December 27, 1983

INVENTOR(S) : Frederick A. Stich

It is certified that error appears in the above-identified patent and that said Letters Patent are hereby corrected as shown below:

Column 2 line 7, correct "circit" to read--circuit--.
Column 3 line 8, correct "schmatic" to read--schematic--.
Column 3 line 37, correct "betweenn" to read--between--.
Column 3 line 63, correct "represnets" to read--represents--.
Column 9 line 12, correct "twp" to read--two--.
Column 11 line 20, correct "andb" to read--and--.
Column 16 line 48, correct "maggnitude" to read--magnitude--.

Claim 1, column 17 line 61, correct "monotonically-charging" to read--monotonically-changing--.

Claim 5, column 18 line 31, after "when" add--the magnitude--.

Claim 11, column 19 line 9, correct "overcurrent;" to read--overcurrent--.

Claim 18, column 20 line 28, correct "no-harmonic" to read--non-harmonic--.

Signed and Sealed this

Tenth Day of April 1984

[SEAL]

Attest:

GERALD J. MOSSINGHOFF

Attesting Officer    Commissioner of Patents and Trademarks